US012740484B2

(12) United States Patent
Lo et al.

(10) Patent No.: US 12,740,484 B2
(45) Date of Patent: Sep. 15, 2026

(54) RADIANT SUBSTRATE HEATING FOR THERMOCOMPRESSIVE BONDING AND APPARATUS FOR IMPLEMENTING THE SAME

(71) Applicant: Taiwan Semiconductor Manufacturing Company Limited, Hsinchu (TW)

(72) Inventors: Ming-Hua Lo, Taoyuan City (TW); Wei-Hung Lin, Xinfeng Township (TW); Chung-Chih Chen, Hsinchu (TW); Hsin-Hsien Wu, Hsinchu City (TW); Chyi Shyuan Chern, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 560 days.

(21) Appl. No.: 18/312,644

(22) Filed: May 5, 2023

(65) Prior Publication Data

US 2024/0371816 A1 Nov. 7, 2024

(51) Int. Cl.
*H10W 90/00* (2026.01)
*H10W 72/00* (2026.01)

(52) U.S. Cl.
CPC ......... *H10W 90/00* (2026.01); *H10W 90/701* (2026.01); *H10W 72/07232* (2026.01); *H10W 90/724* (2026.01); *H10W 90/734* (2026.01)

(58) Field of Classification Search
CPC . H01L 2021/60105; H01L 2021/60112; H01L 21/603; H01L 2224/812–81203;
(Continued)

(56) References Cited

U.S. PATENT DOCUMENTS

2021/0398940 A1* 12/2021 Kim ........................ B23K 26/50
2022/0302081 A1 9/2022 Hsu et al.
(Continued)

FOREIGN PATENT DOCUMENTS

CN 102194707 A 9/2011
TW 201810443 A 3/2018
TW 202038399 A 10/2020

OTHER PUBLICATIONS

Solder Alloy Melting Temperature, Technic Inc, https://www.technic.com/sites/default/files/resources/Solder%20Alloy%20Melting%20Temperature.pdf, retrieved 2025 (Year: 2025).*
(Continued)

*Primary Examiner* — Julio J Maldonado
*Assistant Examiner* — Eric Manuel Mulero Flores
(74) *Attorney, Agent, or Firm* — The Marbury Law Group, PLLC

(57) ABSTRACT

A bonded assembly may be formed by: disposing a packaging substrate having substrate-side bonding structures over a transparent plate; heating the packaging substrate using radiative heating in which a radiative heating source provides radiation to a bottom surface of the packaging substrate through the transparent plate; attaching a semiconductor die having die-side bonding structures to a bottom of a thermocompressive bonding head; bringing the semiconductor die and the packaging substrate to indirect contact with each other with an array of solder material portions therebetween; and bonding the semiconductor die to the packaging substrate by reflowing and solidifying the solder material portions.

20 Claims, 13 Drawing Sheets

(58) Field of Classification Search
CPC ....... H01L 2021/6012; H01L 21/67115; H10P 72/0436; H10P 74/20; H10P 74/23; H10P 74/238; H10W 72/0711; H10W 72/07232; H10W 72/07235; H10W 72/07236
See application file for complete search history.

(56) References Cited

U.S. PATENT DOCUMENTS

2022/0336715 A1* 10/2022 Chen .................. H10H 20/8312
2023/0088061 A1* 3/2023 Park ..................... B23K 1/0056
219/121.76

OTHER PUBLICATIONS

Optical Quartz Glass—Synthetic Fused Silica: Optical Transmission, Prazisions Glas und Optik, https://www.pgo-online.com/intl/curves/quartz-glass-transmission.html, retrieved 2025 (Year: 2025).*
TW Patent and Trademark Office; TW Application No. 112124707; Notice of Allowance mailed Aug. 27, 2024; 8 pages.

* cited by examiner

RADIANT SUBSTRATE HEATING FOR THERMOCOMPRESSIVE BONDING AND APPARATUS FOR IMPLEMENTING THE SAME

BACKGROUND

Thermocompressive bonding is a semiconductor packaging technique used to bond a semiconductor die to a substrate using heat and pressure. During this process, the devices and dies may experience induced thermal damage and thermal cycling. Induced thermal damage may occur when heat is applied to the semiconductor. The damage may manifest itself in a variety of ways, including changes to the material properties of the semiconductor, such as changes in the crystal structure, or the introduction of defects in the material. Such thermal damage may impact the electrical properties of the semiconductor, potentially leading to reliability issues or failure. Thermal cycling during thermocompressive bonding may also induce thermal damage to semiconductor devices in a semiconductor die, thereby degrading device performance of the semiconductor devices. This effect may be caused by repeated heating and cooling of the semiconductor during the bonding process. The heating and cooling may cause thermal expansion and contraction, which may lead to mechanical stress within the materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
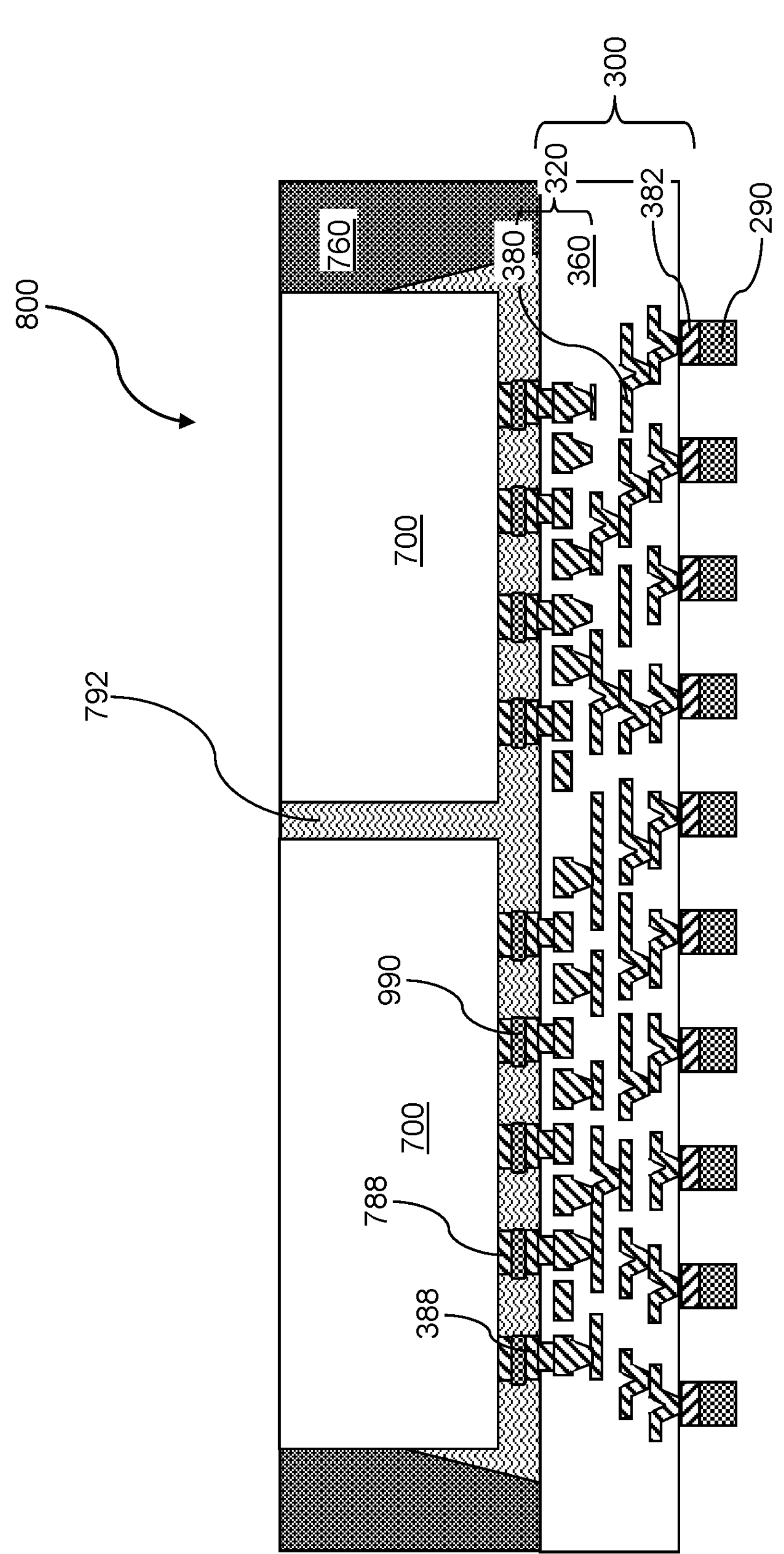
FIG. 1 is a vertical cross-sectional view of a semiconductor die according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to thermal compression bonding process for bonding a semiconductor die to a packaging substrate and apparatuses for effecting the same. Thermal Compression Bonding (TCB) is used in the art for flip chip bonding in electronic packaging, particularly in the instances of Chip-on-Wafer-on-Substrate (CoWoS) packages. In this process, a thermocompressive bonding head applies heat to solder material potions through a semiconductor die. The temperature of the bottom portion of the thermocompressive bonding head during TCB is higher than the reflow temperature of solder material portions, and is typically about 280 degrees Celsius or higher. Such an elevated temperature for a TCB process may have a negative impact on the performance and reliability of a semiconductor die due to induced thermal damage and thermal cycling.

Embodiments of the present disclosure use a combination of a radiant heating and a transparent substrate to heat the bottom side of a packaging substrate. The packaging substrate may be heated to a higher temperature than a semiconductor die during the TCB process of the present disclosure. The bottom surface of the thermocompressive bonding head may be held at a temperature that is lower than the reflow temperature of solder material portions. Thus, the thermal cycling on the semiconductor die during the TCB process of the present disclosure is less than thermal cycling in TCB processes that applies heat for reflowing solder material portions through a semiconductor die. Further, radiative heating of the packaging substrate through a transparent substrate provides temporal temperature profiling, i.e., temperature ramping during the various steps of the TCB process of the present disclosure. Thus, the embodiment TCB processes of the present disclosure may provide more uniform reflow of the solder material portions and enhanced reliability of bonding structures. The various aspects and embodiments of the present disclosure are described with reference to accompanying drawings herebelow.

Referring to FIG. 1, an exemplary semiconductor die 800 is used, which may be subsequently used to form a bonded assembly of a semiconductor die 800 and a packaging substrate according to an embodiment of the present disclosure. The exemplary semiconductor die 800 may be a composite die including an assembly of at least one semiconductor die 700 and an interposer 300 including a redistribution structure 320. The redistribution structure 320 may comprise redistribution metal interconnects 380 embedded in redistribution dielectric layers 360.

The redistribution dielectric layers 360 include a respective dielectric polymer material such as polyimide (PI), benzocyclobutene (BCB), or polybenzobisoxazole (PBO). Each redistribution dielectric layer 360 may be formed by spin coating and drying of the respective dielectric polymer material. The thickness of each redistribution dielectric layer 360 may be in a range from 2 microns to 40 microns, such as from 4 microns to 20 microns.

Each of the redistribution wiring interconnects 380 may comprise a respective stack of a metallic seed layer and an electroplated metallic fill material (such as copper, nickel, or a stack of copper and nickel). The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the redistribution wiring interconnects 380 may include copper, nickel, or copper and nickel. The thickness of each line portion of the redistribution wiring interconnects 380 may be in a range from 2 microns to 40 microns, such as from 4 microns to 10 microns, although lesser or greater thicknesses may also be used. The total number of levels of wiring in the interposer 300 may be in a range from 1 to 10.

The interposer 300 may comprise on-interposer bump structures 388, which may be used to attach the at least one semiconductor die 700. The metallic material of the on-interposer bump structures 388 may include copper. Other metallic materials are within the contemplated scope of disclosure. The on-interposer bump structures 388 may have horizontal cross-sectional shapes of rectangles, rounded rectangles, or circles. Other horizontal cross-sectional shapes may be within the contemplated scope of disclosure.

Typically, the on-interposer bump structures 388 may be configured for microbump bonding, and may have a thickness in a range from 10 microns to 100 microns, although lesser or greater thicknesses may also be used. In such an embodiment, the on-interposer bump structures 388 may be formed as an array of microbumps (such as copper pillars) having a lateral dimension in a range from 10 microns to 50 microns, and having a pitch in a range from 20 microns to 100 microns.

The at least one semiconductor die 700 may include any set of semiconductor dies known in the art. In one embodiment, the at least one semiconductor die 700 may include at least one system-on-chip (SoC) die and/or at least one memory die. Optionally, the at least one semiconductor die 700 may include at least one surface mount die known in the art. Each SoC die may comprise an application processor die, a central processing unit die, or a graphic processing unit die. In one embodiment, the at least one memory die may comprise a high bandwidth memory (HBM) die that includes a vertical stack of static random access memory dies. In one embodiment, the at least one semiconductor die 700 may include at least one system-on-chip (SoC) die and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die 700 may comprise a respective array of on-die bump structures 788. Each array of on-die bump structures 788 may be bonded to an array of on-interposer bump structures 388 through a respective array of solder material portions 990. An underfill material portion 792 may laterally surround the array(s) of solder material portions 990. A molding compound matrix 760 may laterally surround the underfill material portion 792 and the at least one semiconductor die 700.

The exemplary semiconductor die 800 may comprise die-side bonding structures 382. In one embodiment, the die-side bonding structures 382 may be located on the redistribution dielectric layers 360 such that surfaces of the die-side bonding structures 382 are physically exposed. In one embodiment, the die-side bonding structures 382 may comprise a layer stack including a metallic seed layer and an electroplated copper. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The electroplated copper comprises copper at an atomic percentage in a range from 95% to 99.9999%. The thickness of the electroplated copper material may be in a range from 4 microns to 30 microns, such as from 6 microns to 20 microns, although lesser or greater thicknesses may also be used. The die-side bonding structures 382 may be formed as a two-dimensional periodic array of die-side bonding structures 382, such as a rectangular periodic array of die-side bonding structures 382.

In one embodiment, a two-dimensional array of solder material portions 290 may be provided on the two-dimensional array of die-side bonding structures 382. Alternatively, a two-dimensional array of solder material portions 290 may be provided on a two-dimensional array of substrate-side bonding structures on a packaging substrate. See e.g., FIGS. 2B and 5B.

While the present disclosure is described using an embodiment in which the semiconductor die 800 is a fan-out package including an interposer and at least one semiconductor die 700, embodiments are expressly contemplated herein in which a semiconductor die 700 may be used as a semiconductor die 800. In this embodiment, the semiconductor die 800 may consist of a semiconductor die 700, and a two-dimensional array of die-side bonding structures 382 may be formed directly on a horizontal surface of the semiconductor die 700.

Figure 2A:
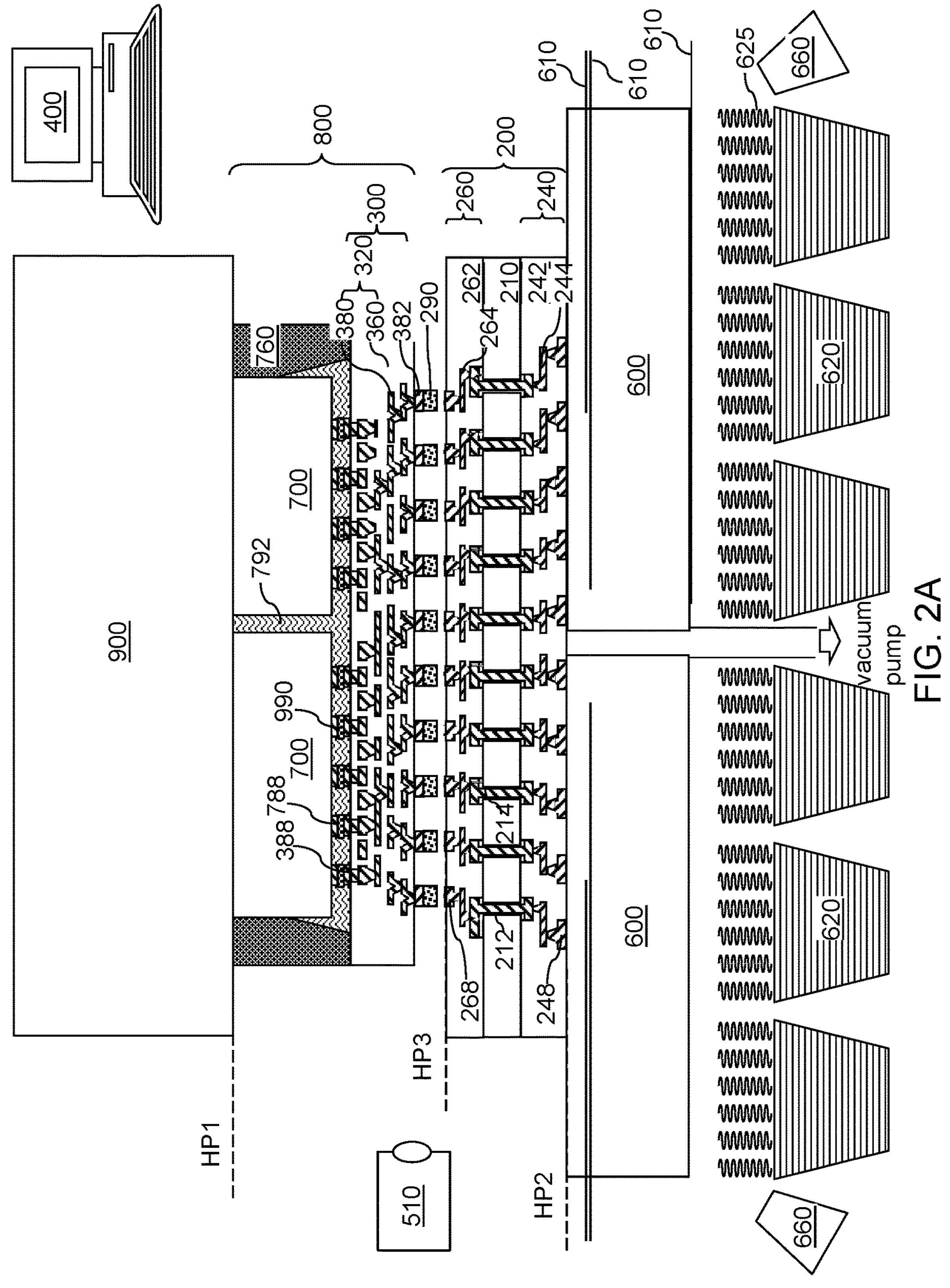
FIG. 2A is a vertical cross-sectional view of a first bonding configuration using a first bonding apparatus prior to bonding a semiconductor die to a substrate according to an embodiment of the present disclosure.
Figure 2B:
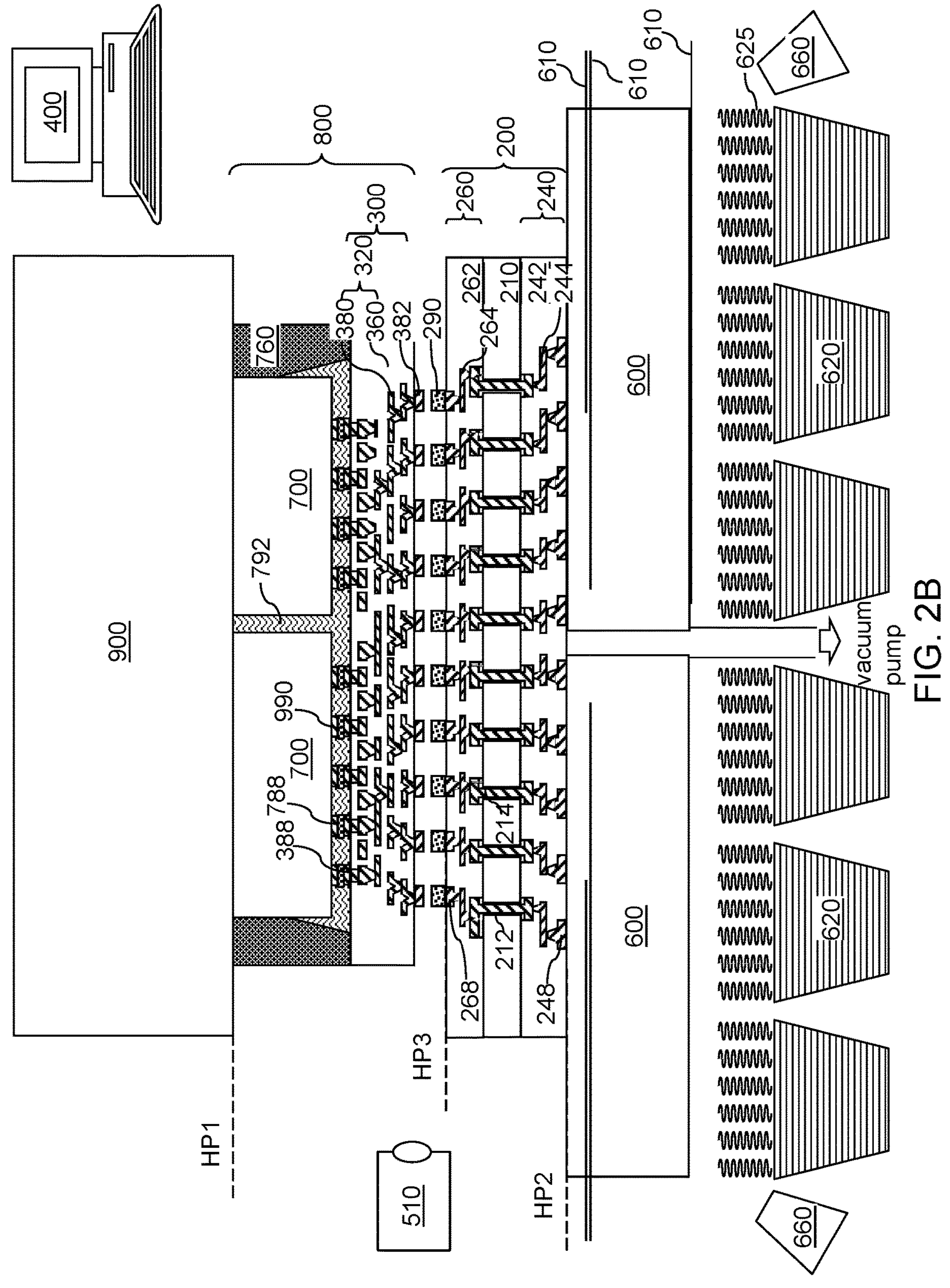
FIG. 2B is a vertical cross-sectional view of a second bonding configuration using the first bonding apparatus prior to bonding a semiconductor die to a substrate according to an embodiment of the present disclosure.

Referring to FIGS. 2A and 2B, a first exemplary bonding apparatus is illustrated after mounting a semiconductor die 800 to a bottom side of a thermocompressive bonding head 900, and after loading a packaging substrate 200 on a horizontal top surface of a transparent plate 600. FIG. 2A illustrates a first bonding configuration in which an array of solder material portions 290 is provided on an array of die-side bonding structures 382 on the semiconductor die 800. FIG. 2B illustrates a second bonding configuration in which an array of solder material potions 290 is provided on an array of substrate-side bonding structures 268 provided on a packaging substrate 200.

Generally, a semiconductor die 800 and a packaging substrate 200 are provided. The semiconductor die 800 illustrated in FIGS. 2A and 2B may be the same as the semiconductor die 800 as illustrated in FIG. 1, or may be any other semiconductor die provided that an array of die-side bonding structures 382 is provided thereupon.

The packaging substrate 200 may be any type of packaging substrate provided that an array of substrate-side bonding structures 268 is provided thereupon. For example, the packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package of one type, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a die-side surface laminar circuit (SLC) 260. The board-side SLC may include board-side insulating layers 242 embedding board-side wiring interconnects 244. The die-side SLC 260 may include die-side insulating layers 262 embedding die-side wiring interconnects 264. The board-side insulating layers 242 and the die-side insulating layers 262 may include a photosensitive epoxy material that may be lithographically patterned and subsequently cured. The board-side wiring interconnects 244 and the die-side wiring interconnects 264 may include copper that may be deposited by electroplating within patterns in the board-side insulating layers 242 or the die-side insulating layers 262.

In one embodiment, the packaging substrate 200 includes a die-side surface laminar circuit 260 comprising die-side wiring interconnects 264 connected to an array of die-side bonding structures 268, and a board-side surface laminar circuit 240 including board-side wiring interconnects 244 connected to an array of board-side bonding structures 248. The array of board-side bonding structures 248 is configured to allow bonding through solder balls. The array of die-side bonding structures 268 may be configured to allow bonding through C4 solder balls. Generally, any type of packaging substrate 200 may be used. While the present disclosure is described using an embodiment in which the packaging substrate 200 includes a die-side surface laminar circuit 260 and a board-side surface laminar circuit 240, embodiments are expressly contemplated herein in which one of the die-side surface laminar circuit 260 and the board-side surface laminar circuit 240 is omitted, or is replaced with an array of bonding structures such as microbumps. In an illustrative example, the die-side surface laminar circuit 260 may be replaced with an array of microbumps or any other array of bonding structures.

Generally, the array of solder material portions 290 may be attached to the die-side bonding structures 382 prior to bringing the semiconductor die 800 and the packaging substrate 200 to indirect contact with each other as illustrated in FIG. 2A, or the array of solder material portions 290 may be attached to the substrate-side bonding structures 268 prior to bringing the semiconductor die 800 and the packaging substrate 200 to indirect contact with each other as illustrated in FIG. 2B.

Referring collectively to FIGS. 2A and 2B again, a bonding apparatus according to an embodiment of the present disclosure is illustrated after mounting a semiconductor die 800 to a bottom side of a thermocompressive bonding head 900 and after loading a packaging substrate 200 on a top surface of the transparent plate 600. The transparent plate 600 has an average optical transmission coefficient greater than 80% in a wavelength range from 400 nm to 2 microns. The thickness of the transparent plate 600 may be in a range from 1 mm to 10 mm, although lesser and greater thicknesses may also be used. The transparent plate 600 may comprise fused silica, quartz, sapphire, calcium fluoride, magnesium fluoride, etc.

The transparent plate 600 may comprise at least one through-hole therethrough. The bottom side of each through-hole may be connected to a respective vacuum tube, which is connected to a vacuum pump (not shown). Thus, the packaging substrate 200 may be held firm on the top surface of the transparent plate 600 throughout the alignment process and the bonding process to be subsequently performed.

A radiative heating source may be provided underneath the transparent plate 600. The radiative heating source may be configured to provide radiative heating by providing radiation 625 through the transparent plate 600. In one embodiment, the radiative heating source may comprise a heater 620 that directs incoherent radiation 625 toward the transparent plate 600. For example, the heater 620 may comprise an infrared light source. The radiative heating source may be oriented such that the radiation 625 from the electrical heater 620 may be directed to the bottom surface of the packaging substrate 200. In this manner, the packaging substrate 200 is heated from the bottom side. In one embodiment, the electrical heater 620 may comprise a plurality of heater elements, such as a two-dimensional array of heater elements, that may be independently controlled such that heat flux into the multiple zones within the contact area between the transparent plate 600 and the packaging substrate 200 may be independently controlled. In one embodiment, at least one thermocouple 610 may be embedded within an upper portion of the transparent plate 600 and/or may be located on the backside surface of the transparent plate 600. Alternatively or additionally, at least one non-contact temperature measurement apparatus such as at least one pyrometer 660 may be provided to measure the temperature of the transparent plate 600 at one or more temperature measurement locations located in, or on, the transparent plate 600.

A process controller 400 may be provided, which may be configured to control the temperature and movement of the packaging substrate 200 and the semiconductor die 800, and to control the pressure applied to the solder material portions 290 during a reflow process. The process controller 400 may comprise a processor and a memory in communication with the processor. The process controller 400 may be configured to run an automated bonding process control program.

In one embodiment, the automated bonding process control program is configured to mount the packaging substrate 200 on the top surface of the transparent plate 600, and to mount the semiconductor die 800 on the bottom side of the thermocompressive bonding head 900. The movement of the packaging substrate 200 and the semiconductor die 800 may be effected by at least one robotic unit (not illustrated) that is configured to hold and move the packaging substrate 200 and/or the semiconductor die 800.

The automated bonding process control program is configured to control a thermal output of the radiative heating source (such as the electrical heater 620) based on an input from at least one temperature measurement device (such as at least one thermocouple 610 and/or at least one pyrometer 660). The automated bonding process control program may be used to control the thermal output of the radiative heating source based on an input from at least one temperature control device (such as the at least one thermocouple 610 and/or the at least one pyrometer 660) such that the temperature at each temperature measurement location (such as the tip of each of the at least one thermocouple 610 and/or the temperature measurement location(s) of the at least one pyrometer 660) is maintained at a respective target temperature at each processing step during the bonding process. Thus, the temperature at each temperature measurement location (such as the at least one thermocouple 610 and/or the temperature measurement location(s) of the at least one pyrometer 660) may be maintained at a respective target temperature prior to, and while, the semiconductor die 800 and the packaging substrate 200 are brought to indirect contact with each other through the array of solder material portions 290.

An optical sensor 510 may be optionally provided and directed at the solder material portions 290 to monitor the relative location of the semiconductor die 800, the packaging substrate 200, and the array of solder material portions 290 and/or to monitor the reflow state of the solder material portions 290 during bonding.

The thermocompressive bonding head 900 is configured to hold the semiconductor die 800 over the transparent plate 600. Mounting of the semiconductor die 800 on the bottom surface of the thermocompressive bonding head 900 located within a first horizontal plane HP1 may be controlled by the process controller 400. In one embodiment, the process controller 400 may actuate the movement of the thermocompressive bonding head 900 and optionally movement of a robotic unit (not illustrated) to mount the semiconductor die 800 on a bottom surface of the thermocompressive bonding head 900. Generally, a semiconductor die 800 having die-side bonding structures 382 may be attached to a bottom of a thermocompressive bonding head 900. An array of solder material portions 290 may be attached to the substrate-side bonding structures 268 or to the die-side bonding structures 382.

Mechanical components (not shown) may be optionally provided to hold the packaging substrate 200 stationary on the top surface of the transparent plate 600. Loading of the packaging substrate 200 on the top surface of the transparent plate 600 located within a second horizontal plane HP2 may be controlled by the process controller 400. In one embodiment, the process controller 400 may actuate the movement of the transparent plate 600, or any mechanical component holding the transparent plate 600.

The process controller 400 may be loaded with an automated bonding process control program. The automated bonding process control program may comprise a temperature profile control program that controls the temperature at the interface between the thermocompressive bonding head 900 and the semiconductor die 800 located within the first horizontal plane HP1. This temperature is also referred to as a bonding head temperature. An approximation to the true value of the bonding head temperature, or to be precise, the two-dimensional distribution of the bonding head temperature within the area of the interface between the thermocompressive bonding head 900 and the semiconductor die 800, may obtained from temperature measurement by at least one thermocouple (not shown) embedded in a bottom portion of the thermocompressive bonding head 900.

Further, the temperature profile control program may control the temperature at the interface between the transparent plate 600 and the packaging substrate 200 located within the second horizontal plane HP2. This temperature is also referred to as a plate temperature. An approximation to the true value of the plate temperature, or to be precise, the two-dimensional distribution of the plate temperature within the area of the interface between the transparent plate 600 and the packaging substrate 200, may obtained from temperature measurement by the at least one thermocouple 610 and/or the at least one pyrometer 660. The top surface of the packaging substrate 200 may be located within a third horizontal plane HP3.

According to an aspect of the present disclosure, the plate temperature may be maintained higher than the bonding head temperature throughout the bonding process of the present disclosure. As such, the net heat flow during a reflow step, i.e., while the array of solder material portions 290 are in direct contact with the array of the die-side bonding structures 382 and with the array of substrate-side bonding structures 268.

Figure 3:
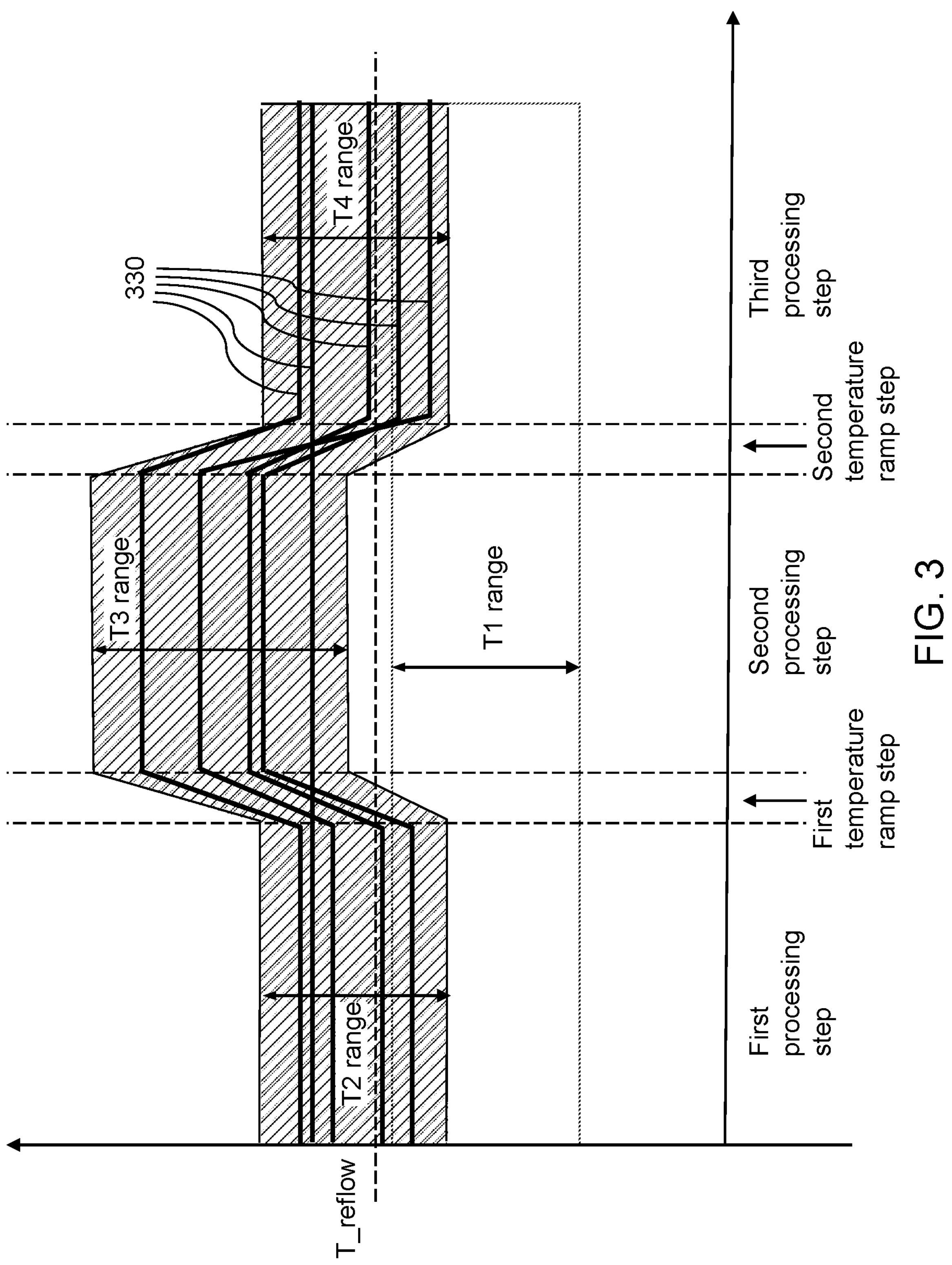
FIG. 3 is a graph illustrating the ranges of parameters that may be selected for various temperatures during a bonding process according to various embodiments of the present disclosure.

Referring to FIG. 3, a temporal profile range of the bonding head temperature and a temporal profile range of the plate temperature are illustrated. The temporal profile range of the bonding head temperature is represented by a rectangular area labeled as "T1 range." The temporal profile range of the plate temperature is represented by an hatched area. Exemplary temperature profiles 330 for the plate temperature are illustrated in solid lines.

Generally speaking, the bonding process of the present disclosure may include a first processing step during which the bonding head temperature is constant (i.e., time-invariant) and the plate temperature is constant; an optional first temperature ramp step during which at least one of the bonding head temperature and the plate temperature may be ramped up; a second processing step during which the bonding head temperature is constant and the plate temperature is constant; an optional second temperature ramp step during which at least one of the bonding head temperature and the plate temperature may be ramped down; and a third processing step during which the bonding head temperature is constant and the plate temperature is constant. Each constant temperature and, if applicable, each temperature ramp rate, may be selected as long as the bonding head temperature as a function of time is entirely within the temporal profile range for the bonding head temperature (represented by the rectangular area labeled as "T1 range"), and the plate temperature as a function of time is entirely within the temperature profile range for the plate temperature (represented by the hatched area).

Generally, the temperature profile range for the bonding head temperature may be constant through the bonding process, or may be time-dependent with at least one temperature ramp. The temperature profile range for the plate temperature may be constant through the bonding process, or may be time-dependent with at least one temperature ramp.

In one embodiment, the entirety of the temporal profile range for the bonding head temperature may be below the reflow temperature (represented by a horizontal dotted line) for the solder material portions 290 used for the bonding process. The reflow temperature of the solder material portions 290 is dependent on the material composition. For lead-free solder materials, the reflow temperature may be in a range from 240 degrees Celsius to 260 degrees Celsius. For leaded solder materials, the reflow temperature may be in a range from 183 degrees Celsius to 215 degrees Celsius.

In one embodiment, the automated bonding process control program loaded in the process controller 400 may be configured to receive or determine a solder reflow temperature of solder material portions 290 to be used either as a direct input or as a calculated quantity derived from an input that identifies a material composition of the solder material portions 290. The input for the solder reflow temperature or the material composition of the solder material portions 290 may be provided to the process controller 400 prior to commencing the bonding process, either manually, or automatically based on the processing history of the semiconductor die 800 or the packaging substrate 200.

In one embodiment, the thermal output of the radiative heating source (such as the electrical heater 620) is based on an input from at least one temperature measurement device (such as the at least one thermocouple 610 and/or the at least one pyrometer 660) such that the temperature at each temperature measurement location is maintained at a respective target temperature throughout the bonding process, i.e., prior to, and while, the semiconductor die 800 and the packaging substrate 200 are brought to indirect contact with each other. In one embodiment, each of the respective target temperature may be in a range from a reflow temperature of the solder material portions 290 less 20 degrees Celsius to the reflow temperature of the solder material portions 290 plus 110 degrees Celsius prior to bringing the semiconductor die 800 and the packaging substrate 200 to indirect contact with each other.

According to an embodiment of the present disclosure, the bottom surface of the thermocompressive bonding head 900 is held at a first temperature T1 and the top surface of the transparent plate 600 is held at a second temperature T2 that is higher than the first temperature T1 during the first processing step. The second temperature T2 is higher than the reflow temperature of the solder material portions 290, and the first temperature T1 is lower than a reflow temperature of the solder material portions 290.

In one embodiment, the automated bonding process control program may set the first temperature T1 below the solder reflow temperature, and may set the second temperature T2 above, at, or below, the solder reflow temperature. In one embodiment, the second temperature T2 may be in a range from the reflow temperature of the solder material portions 290 less 20 degrees Celsius to the reflow temperature of the solder material portions 290 plus 110 degrees Celsius during the first processing step. In one embodiment, the second temperature T2 may be in a range from the reflow temperature of the solder material portions 290 to the reflow temperature of the solder material portions 290 plus 110 degrees Celsius during the first processing step. In one embodiment, the second temperature T2 may be higher than 220 degrees Celsius, and the first temperature T1 may be lower than the second temperature T2 by at least 20 degrees Celsius.

In one embodiment, the first temperature T1 may be in a range from 150 degrees Celsius to 260 degrees Celsius, such as from 180 degrees Celsius to 220 degrees Celsius. In one embodiment, the second temperature T2 may be in a range from 220 degrees Celsius to 350 degrees Celsius, such as from 250 degrees Celsius to 320 degrees Celsius.

The semiconductor die 800 may be aligned along horizontal directions such that the array of die-side bonding structures 382 face the array of substrate-side bonding structures 268 with the array of solder material portions 290 therebetween. Subsequently, the semiconductor die 800 and the packaging substrate 200 may be brought into indirect contact with each other with the array of solder material portions 290 therebetween. As used herein, an "indirect contact" between a first element and a second element refers to a geometry in which the first element and the second element are not in physical contact with each other, but are in physical contact with a third element, or an intermediary element. Thus, the array of solder material portions 290 may be in physical contact, i.e., direct contact, with both the array of die-side bonding structures 382 and with the array of substrate-side bonding structures 268. In one embodiment, the automated bonding process control program loaded in the process controller 400 may be configured to bring the semiconductor die 800 and the packaging substrate 200 to indirect contact with each other with an array of solder material portions 290 therebetween during the first processing step.

In one embodiment, the semiconductor die 800 and the packaging substrate 200 are brought to indirect contact with each other while maintaining a top surface of the semiconductor die 800 at the first temperature T1 and while maintaining a bottom surface of the packaging substrate 200 at the second temperature T2 that is higher than the first temperature T1.

Figure 4:
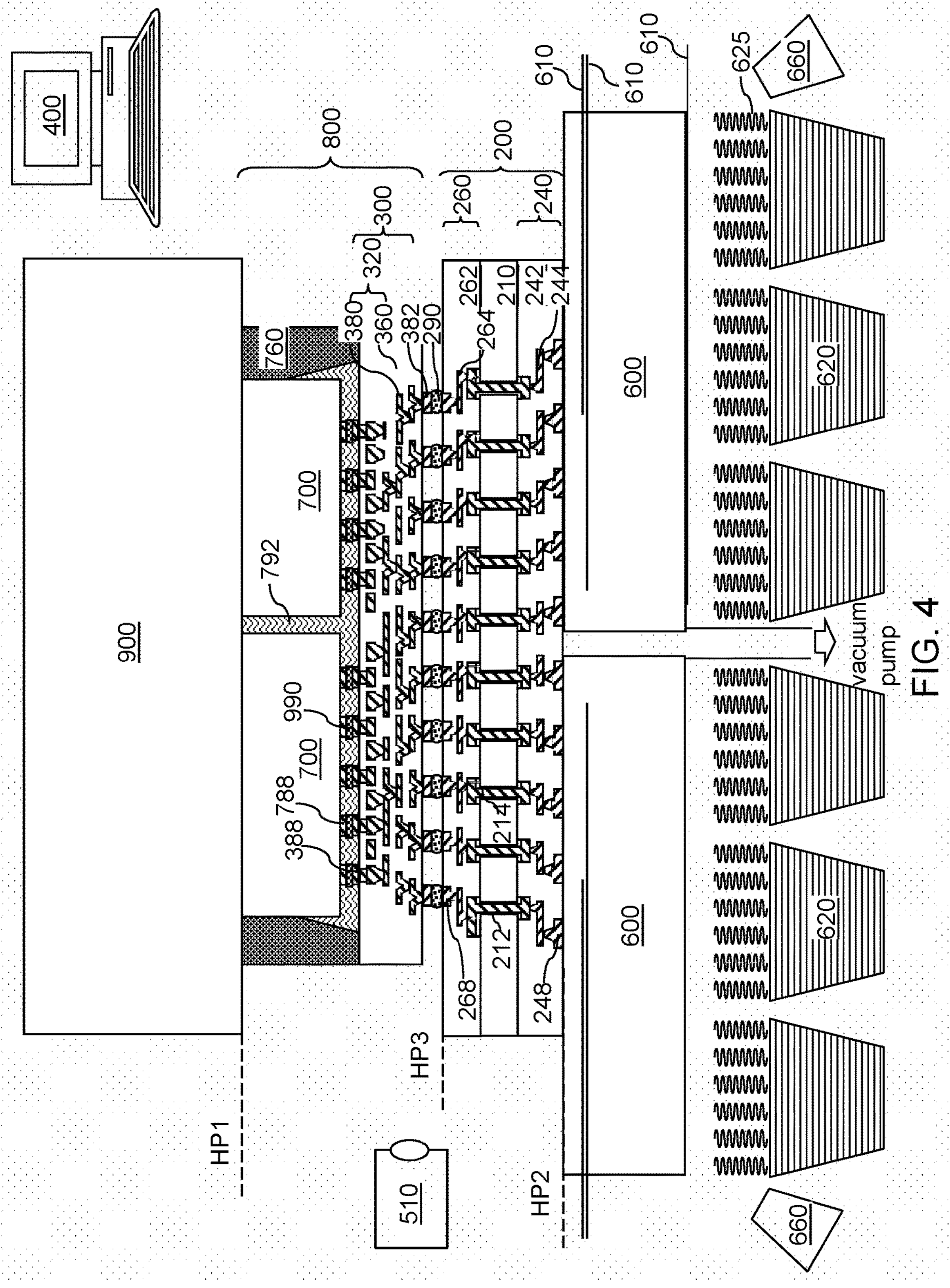
FIG. 4 is a vertical cross-sectional view of the first bonding apparatus during bonding the semiconductor die to the packaging substrate according to an embodiment of the present disclosure.

Referring to FIGS. 3 and 4, the semiconductor die 800 may be bonded to the packaging substrate 200 by reflowing and solidifying the solder material portions 290 after the semiconductor die 800 and the packaging substrate 200 are brought to indirect contact with each other with the array of solder material portions 290 therebetween. In one embodiment, reflowing and solidifying of the solder material portions 290 comprises temporarily increasing the temperature at the bottom surface of the packaging substrate 200 while maintaining the temperature at the bottom of the thermocompressive bonding head 900 at a constant temperature, which may be lower than the reflow temperature of the solder material portions 290. In one embodiment, the temperature of the bottom of the thermocompressive bonding head 900 may remain below the reflow temperature of the solder material portions 290 for the entire duration of time in which the solder material portions 290 are reflowed and solidified.

In one embodiment, the automated bonding process control program is configured to commence the second processing step after the semiconductor die 800 and the packaging substrate 200 are brought to the indirect contact with each other. In one embodiment, the automated bonding process control program is configured to commence the first temperature ramp step after the semiconductor die 800 and the packaging substrate 200 are brought to the indirect contact with each other. In one embodiment, the automated bonding process control program is configured to bring the semiconductor die 800 and the packaging substrate 200 to the indirect contact with each other prior to termination of the first processing step.

According to an aspect of the present disclosure, the second processing step may be performed to reflow the solder material portion 290. The top surface of the plate 600 may be held at a third temperature T3 not lower than the second temperature T2 during the second processing step. In one embodiment, the third temperature T3 in a range from the reflow temperature of the solder material portions 290 plus 5 degrees Celsius to the reflow temperature plus 110 degrees during the second processing step, and may be in a range from the reflow temperature of the solder material portions 290 plus 15 degrees Celsius to the reflow temperature plus 110 degrees during the second processing step.

In one embodiment, the thermal output of the radiative heating source (such as the electrical heater 620) based on an input from at least one temperature measurement device (such as the at least one thermocouple 610 and/or the at least one pyrometer 660) such that the temperature at each temperature measurement location (such as the tip of each of the at least one thermocouple 610 and/or the temperature measurement location(s) of the at least one pyrometer 660) is maintained at a respective target temperature throughout the bonding process, including the second processing step and the third processing step. In one embodiment, each of the respective target temperature may be raised during the second processing step to the third target temperature T3, which may be a temperature in a range from the reflow temperature of the solder material portions 290 plus 5 degrees Celsius to the reflow temperature plus 110 degrees during reflow of the solder material portions 290. In one embodiment, the automated bonding process control program may be configured to control the thermal output of the radiative heating source based on an input from at least one temperature measurement device (such as at least one thermocouple 610 and/or at least one pyrometer 660) such that a temperature at each temperature measurement location (such as the tip of each of the at least one thermocouple 610 and/or the temperature measurement location(s) of the at least one pyrometer 660) is maintained at the third temperature T3 during the second processing step. In one embodiment, the automated bonding process control program may be configured to maintain the bottom surface of the thermocompressive bonding head 900 at the first temperature T1 during the second processing step.

The optional second temperature ramp step and the third processing step may be subsequently performed to re-solidify the solder material portions 290. In this embodiment, the automated bonding process control program comprises the third processing step, at which the top surface of the plate 600 is held at a fourth temperature T4 not higher than the third temperature T3. The fourth temperature T4 may be higher than, the same as, or lower than, the reflow temperature of the solder material portions 290.

In embodiments in which at least one pyrometer 660 is used for temperature control, the bottom surface of the packaging substrate 200 may be held at a pre-bonding plate temperature that is lower than the second temperature T2 prior to bringing the semiconductor die 800 and the packaging substrate 200 to indirect contact with each other. The bottom surface of the packaging substrate 200 may be heated to the second temperature T2 after the semiconductor die 800 and the packaging substrate 200 are brought to indirect contact with each other. The bottom surface of the packaging substrate 200 may be cooled to a post-bonding plate temperature that is lower than the second temperature T2 after reflowing and solidifying the solder material portions 290.

In embodiments in which at least one thermocouple 610 is used for temperature control, the bottom surface of the packaging substrate 200 may be held at a pre-bonding plate temperature that is lower than the second temperature T2 prior to bringing the semiconductor die 800 and the packaging substrate 200 to indirect contact with each other by maintaining the temperature at the tip of each thermocouple 610 at a respective target temperature. The correlation between each temperature at the tip of the thermocouple 610 and the temperature at the bottom of a packaging substrate 200 may be established by performing a test using a pyrometer or other test set-up that directly or indirectly measures or estimates the actual temperature at the bottom of a packaging substrate 200. The bottom surface of the packaging substrate 200 may be heated to the second temperature T2 after the semiconductor die 800 and the packaging substrate 200 are brought to indirect contact with each other. The target temperature at the tip of each thermocouple for achieving the second temperature T2 at the bottom of the packaging substrate 200 may be established by performing a test run that uses a temperature measurement apparatus (such as a pyrometer) that measures the temperature at the bottom of a test packaging substrate. The bottom surface of the packaging substrate 200 may be cooled to a post-bonding plate temperature that is lower than the second temperature T2 after reflowing and solidifying the solder material portions 290.

Generally speaking, the temperature at the bottom of the packaging substrate 200 may be controlled by using the at least one pyrometer 660 and using the direct measurement data from the at least one pyrometer 660, and/or by performing a temperature profiling test run in which the at least one thermocouple 610 is used in conjunction with at least one additional temperature measurement device configured to measure the temperature at the bottom of a test packaging substrate, which may be of the same type (e.g., size and design) as the packaging substrate 200 that is employed for an actual bonding process. The at least one additional temperature measurement device may comprise one or more pyrometers 660 and/or additional thermocouples positioned to measure the temperature at the bottom of the test packaging substrate and/or any additional temperature measurement device that may measure or estimate the temperature at the bottom of the test packaging substrate. In other words, the temperature at the bottom of the packaging substrate 200 may be directly measured by the at least one pyrometer 660, or may be estimated by using a temperature correlation data that is obtained by establishing a correlation between measured temperatures at the tip of each thermocouple 610 and measured temperatures of at the bottom of a test packaging substrate during a test temperature profile run.

While the present disclosure is described using embodiments in which at least one pyrometer 660 and at least one thermocouple 610 are simultaneously provided, embodiments are expressly contemplated herein in which only at least one pyrometer 660 or only at least one thermocouple 610 is provided as a temperature measurement device. Generally, in embodiments in which multiple temperature measurement devices are used, a computer program may be configured to calculate an average temperature or a most likely actual temperature at the bottom of the packaging substrate 200 that may be used to determine the "temperature of the bottom surface of the packaging substrate" 200. It is understood that the bottom surface of the packaging substrate 200 is a two-dimensional surface on which a two-dimensional temperature distribution is present at any given time, and that the "temperature of the bottom surface of the packaging substrate" 200 means the temperature of a measured portion of the bottom surface by a single pyrometer, the average (weighted or non-weighted depending on the algorithm employed by an automated program in the process controller 400) of temperatures of multiple measured portions of the bottom surface by multiple pyrometers, or the estimated temperature of the bottom surface of the packaging substrate 200 that is obtained by a combination of temperature correlation data from a prior temperature profiling run and current measurement of temperature (or temperature distribution) provided by the at least one thermocouple 610 during an alignment process, a bonding process, or a post-bonding process. In other words, the temperature of the bottom surface of the packaging substrate 200 refers to a most reliable estimation of the temperature of the bottom surface of the packaging substrate 200 as obtained by direct measurement or by indirect measurement.

While only some exemplary temperature profiles are expressly discussed in the present disclosure, all possible combinations of temperature changes allowed using the combination of the temporal profile range of the bonding head temperature and the temporal profile range of the plate temperature illustrated in FIG. 3 are expressly contemplated, including embodiments in which the bonding head temperature and the plate temperature are constant or time-dependent. An increase, a decrease, and/or time-invariance of each segment of the temperature profile for the bonding head temperature and/or for the plate temperature at each step of the bonding process are expressly contemplated herein provided that such variations are compatible with the combination of the temporal profile range of the bonding head temperature and the temporal profile range of the plate temperature illustrated in FIG. 3.

Figure 5A:
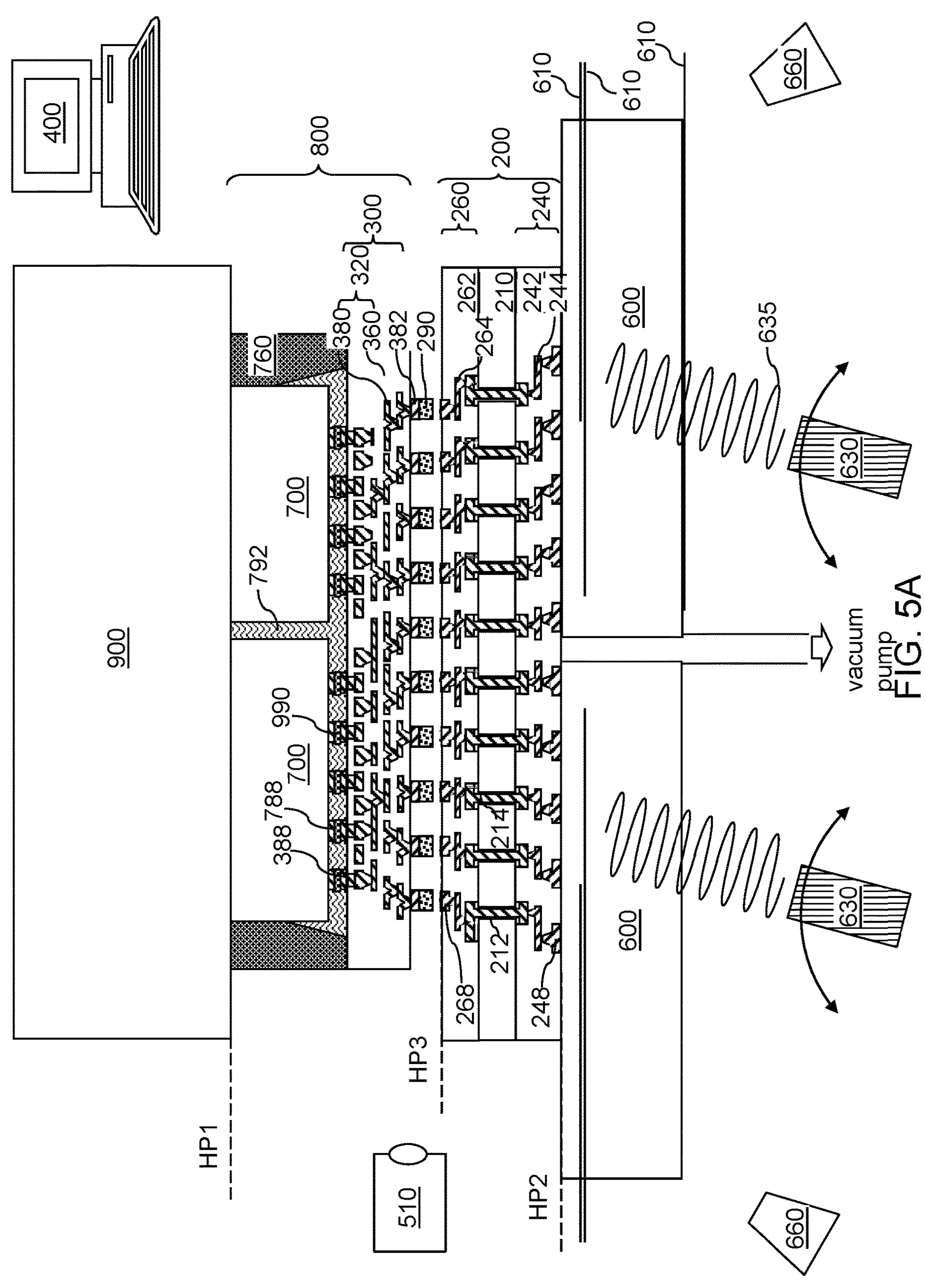
FIG. 5A is a vertical cross-sectional view of a first bonding configuration using a second bonding apparatus prior to bonding a semiconductor die to a substrate according to an embodiment of the present disclosure.
Figure 5B:
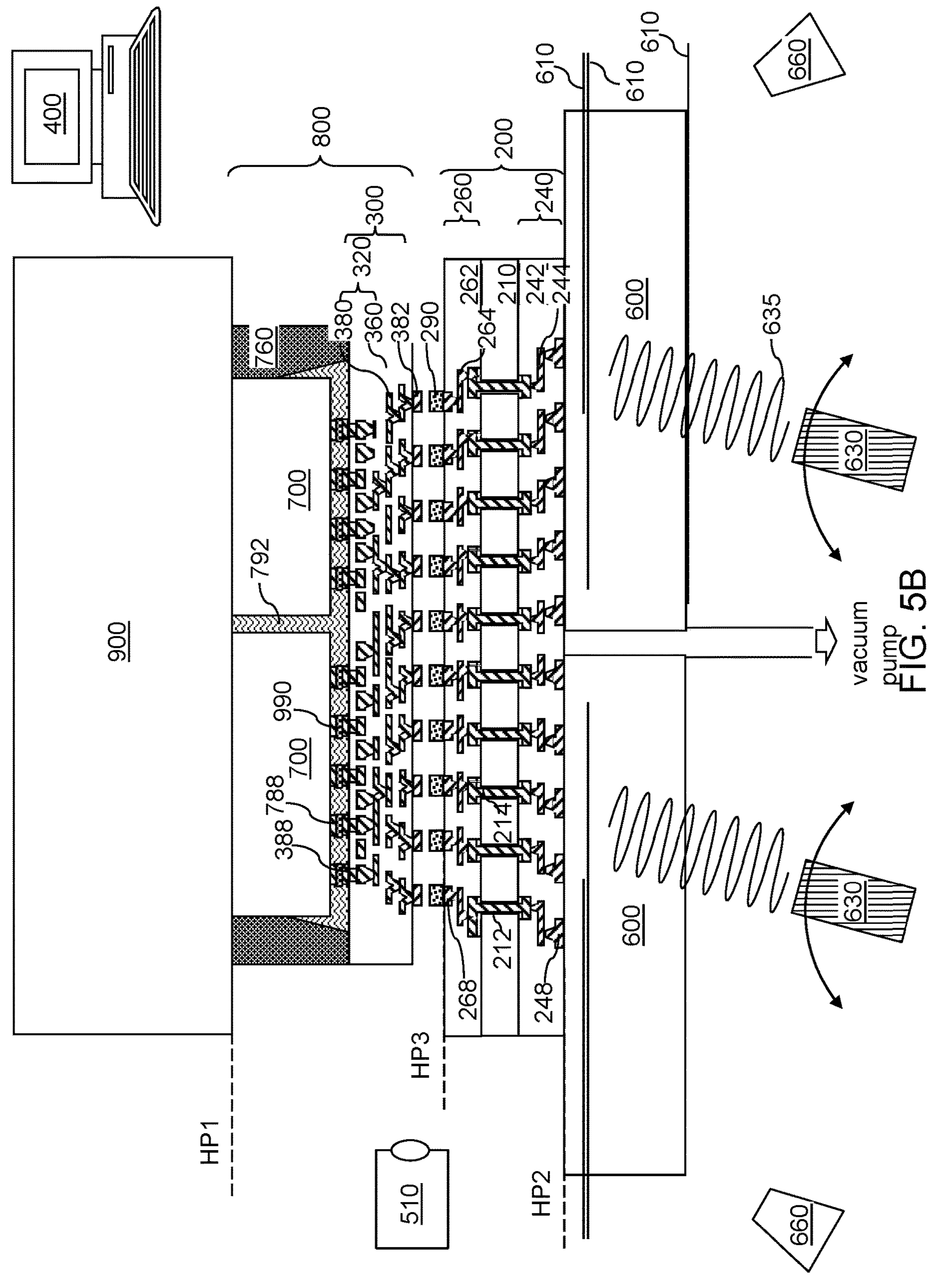
FIG. 5B is a vertical cross-sectional view of a second bonding configuration using the second bonding apparatus prior to bonding a semiconductor die to a substrate according to an embodiment of the present disclosure.

Referring to FIGS. 5A and 5B, a second exemplary bonding apparatus according to an embodiment of the present disclosure is illustrated, which is derived from the first exemplary bonding structure by using at least one laser source 630 in lieu of the electrical heater 620 in the first exemplary bonding apparatus. In one embodiment, the at least one laser source 630 scans a laser beam 635 within an area of the transparent plate 600 in a raster pattern. FIG. 5A illustrates a first bonding configuration in which an array of solder material portions 290 is provided on an array of die-side bonding structures 382 on the semiconductor die 800. FIG. 5B illustrates a second bonding configuration in which an array of solder material potions 290 is provided on an array of substrate-side bonding structures 268 provided on a packaging substrate 200.

Figure 6:
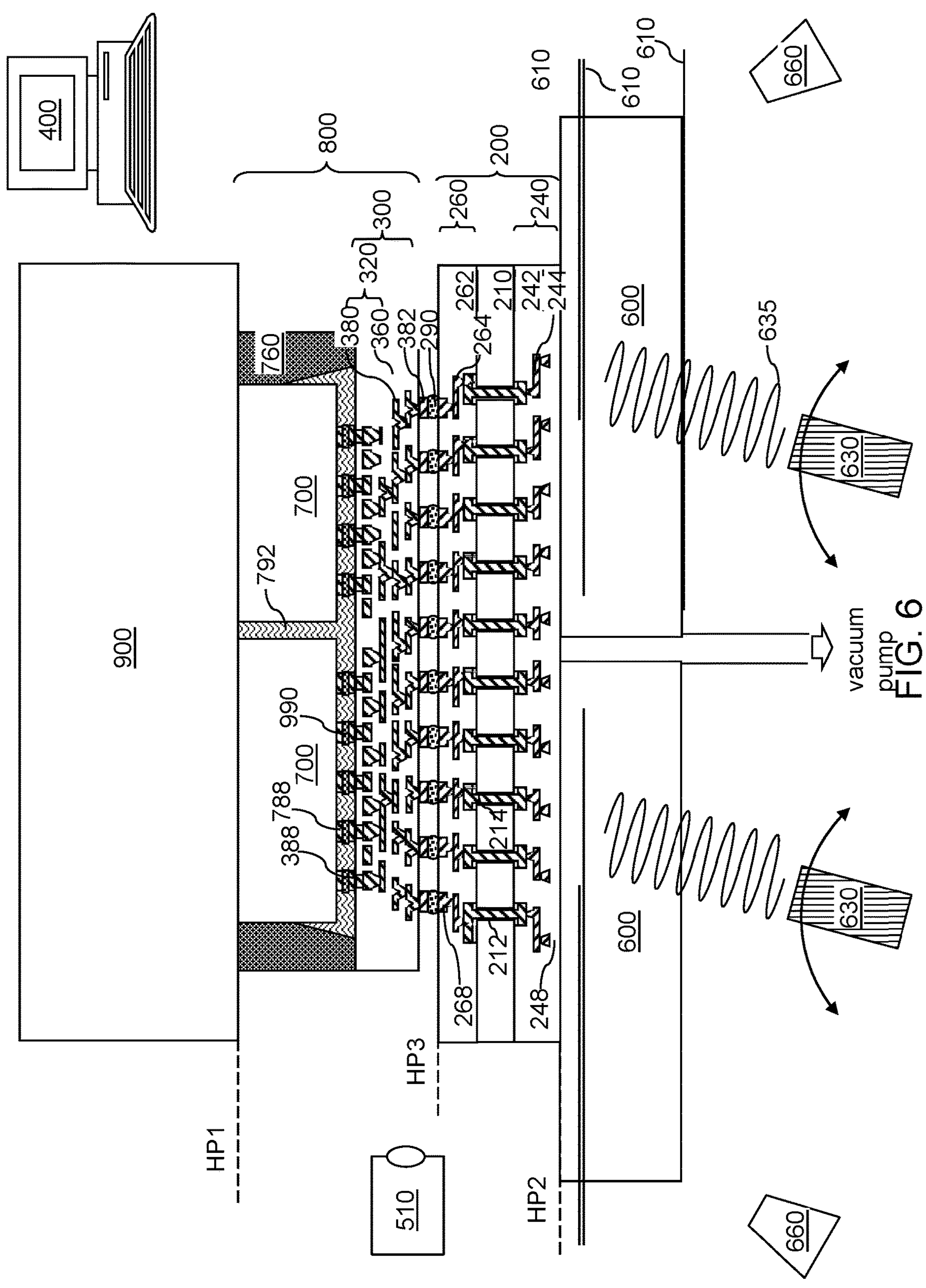
FIG. 6 is a vertical cross-sectional view of the second bonding apparatus during bonding the semiconductor die to the packaging substrate according to an embodiment of the present disclosure.

Generally, the processing steps described with reference to FIGS. 2A, 2B, 3, and 4 may be performed using the second exemplary bonding apparatus illustrated in FIGS. 5A and 5B with the modification of replacement of the electrical heater 620 with the at least one laser source 630. FIG. 6 illustrates the second exemplary bonding apparatus during bonding the semiconductor die 800 to the packaging substrate 200.

Figure 7A:
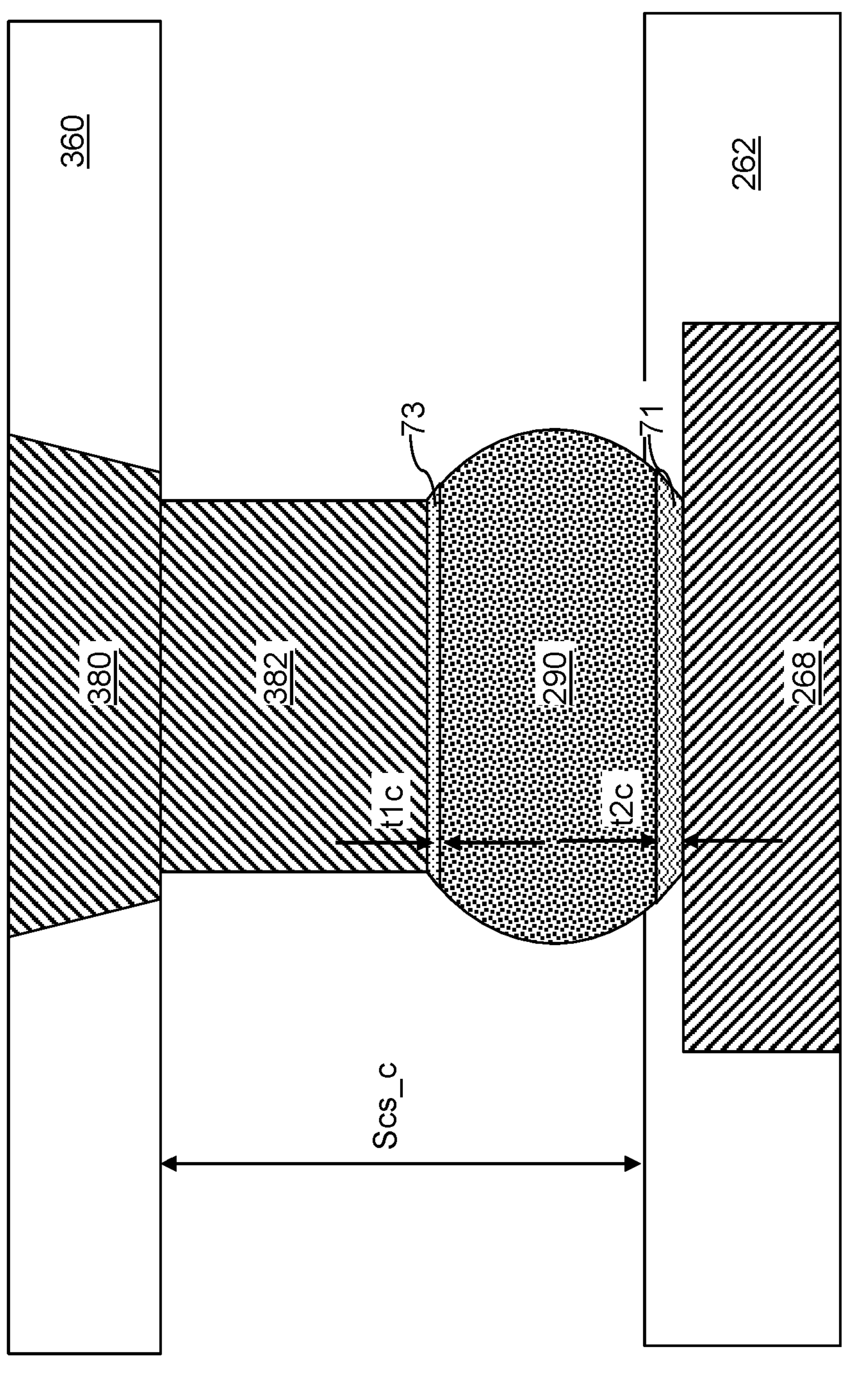
FIG. 7A is a vertical cross-sectional view of a solder material portion in a center region of an array of solder material portions in a bonded assembly according to an aspect of the present disclosure.
Figure 7B:
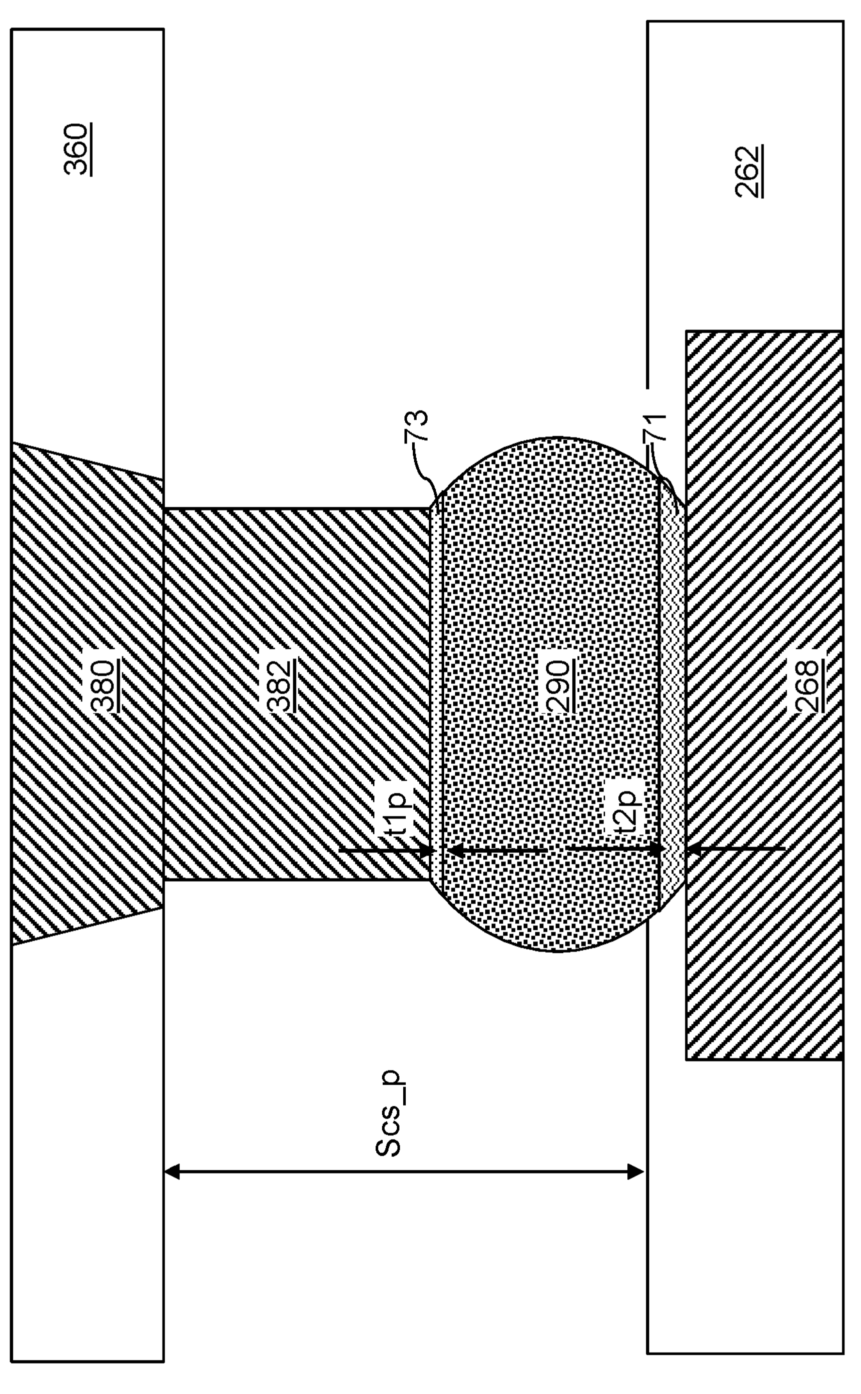
FIG. 7B is a vertical cross-sectional view of a solder material portion in a peripheral region of an array of solder material portions in a bonded assembly according to an aspect of the present disclosure.

Referring to FIGS. 7A and 7B, magnified vertical cross-sectional views of regions around a solder material portion 290 are illustrated after a bonding process of the present disclosure. FIG. 7A shows a solder material portion 290 in a center region of an array of solder material portions 290 in a bonded assembly of the present disclosure. FIG. 7B shows a solder material portion 290 in a peripheral region of an array of solder material portions 290 in a bonded assembly of the present disclosure.

A horizontal surface of the semiconductor die 800 facing the packaging substrate 200 and a horizontal surface of the packaging substrate 200 facing the semiconductor die 800 may be vertically spaced from each other by a vertical spacing. The vertical spacing as measured around a solder material portion 290 that is most proximal to the geometrical center of all volumes of the solder material portions 290 is herein referred to as a center die-substrate spacing Scs_c (illustrated in FIG. 7A), and the vertical spacing as measured around a solder material portion 290 that is most distal from the geometrical center of all volumes of the solder material portions 290 is herein referred to as a peripheral die-substrate spacing Scs_p. As used herein, a geometrical center of a plurality of elements refers to the center of gravity of the all volumes of a set of hypothetical objects that occupies the same volume as the plurality of elements and having a same density throughout.

According to an aspect of the present disclosure, the boding method the present disclosure may provide more uniform temperature distribution in the solder material portions 290 during bonding, and thus, the difference between the center die-substrate spacing Scs_c and the peripheral die-substrate spacing Scs_p may be small. Thermocompressive bonding processes during which a semiconductor die 800 is held at a higher temperature than a packaging substrate 200 results in a center die-substrate spacing that is greater than a peripheral die-substrate spacing by at least 20 microns. The thermocompressive bonding process of the present disclosure may provide a bonded assembly in which the difference between the center die-substrate spacing Scs_c and the peripheral die-substrate spacing Scs_p may be less than 20 microns. For example, the thermocompressive bonding process of the present disclosure may provide a bonded assembly in which the difference between the center die-substrate spacing Scs_c and the peripheral die-substrate spacing Scs_p may be in a range from 1 micron to 20 microns, such as from 2 microns to 10 microns.

Further, the boding method the present disclosure may increase the thickness of a bottom interfacial metallic compound layer 71 compared to bonding methods in which the semiconductor die is held at a higher temperature than the packaging substrate during bonding. Generally, a bottom intermetallic compound layer 71 may be formed between a solder material portion 290 and a substrate-side bonding structures 268, and a top intermetallic compound layer 73 may be formed between the solder material portion 290 and a die-side bonding structure 382. The bottom intermetallic compound layer 71 and the top intermetallic compound layer 73 include a respective intermetallic alloy of the solder material of the solder material portions 290 and copper (which is the material of the substrate-side bonding structures 268 and the die-side bonding structure 382).

The thickness of the top intermetallic compound layer 73 in a solder material portion 290 that is most proximal to the geometrical center of all volumes of the solder material portions 290 is herein referred to as a center first thickness t1*c*. The thickness of the bottom intermetallic compound layer 71 in the solder material portion 290 that is most proximal to the geometrical center of all volumes of the solder material portions 290 is herein referred to as a center second thickness t2*c*. The thickness of the top intermetallic compound layer 73 in a solder material portion 290 that is most distal from the geometrical center of all volumes of the solder material portions 290 is herein referred to as a peripheral first thickness t1*p*. The thickness of the bottom intermetallic compound layer 71 in the solder material portion 290 that is most distal from the geometrical center of all volumes of the solder material portions 290 is herein referred to as a peripheral second thickness t2*p*.

The thermocompressive bonding process of the present disclosure may provide a bonded assembly in which the peripheral second thickness t2*p* is the same as the center second thickness t2*c*. Further, the bonding process of the present disclosure may provide a bonded assembly in which the ratio of the peripheral second thickness t2*p* to the peripheral first thickness t1*p* is increased compared to structures formed by providing a higher temperature to a semiconductor die than to a packaging substrate. The ratio of the peripheral second thickness t2*p* to the peripheral first thickness t1*p* in the bonded assembly of the present disclosure may be greater than 0.6, and may be in a range from 0.6 to 1.5, such as from 0.8 to 1.2 and/or from 1.0 to 1.2.

In addition, the bonding process of the present disclosure may provide a bonded assembly in which the ratio of the center second thickness t2*c* to the center first thickness t1*c* is increased compared to structures formed by providing a higher temperature to a semiconductor die than to a packaging substrate. The ratio of the center second thickness t2*c* to the center first thickness t1*c* in the bonded assembly of the present disclosure may be greater than 0.6, and may be in a range from 0.6 to 1.5, such as from 0.8 to 1.2 and/or from 1.0 to 1.2. After the thermocompressive bonding process is complete, a second underfill 292 may be formed around the solder joints 290 by applying and shaping a second underfill material.

Figure 8:
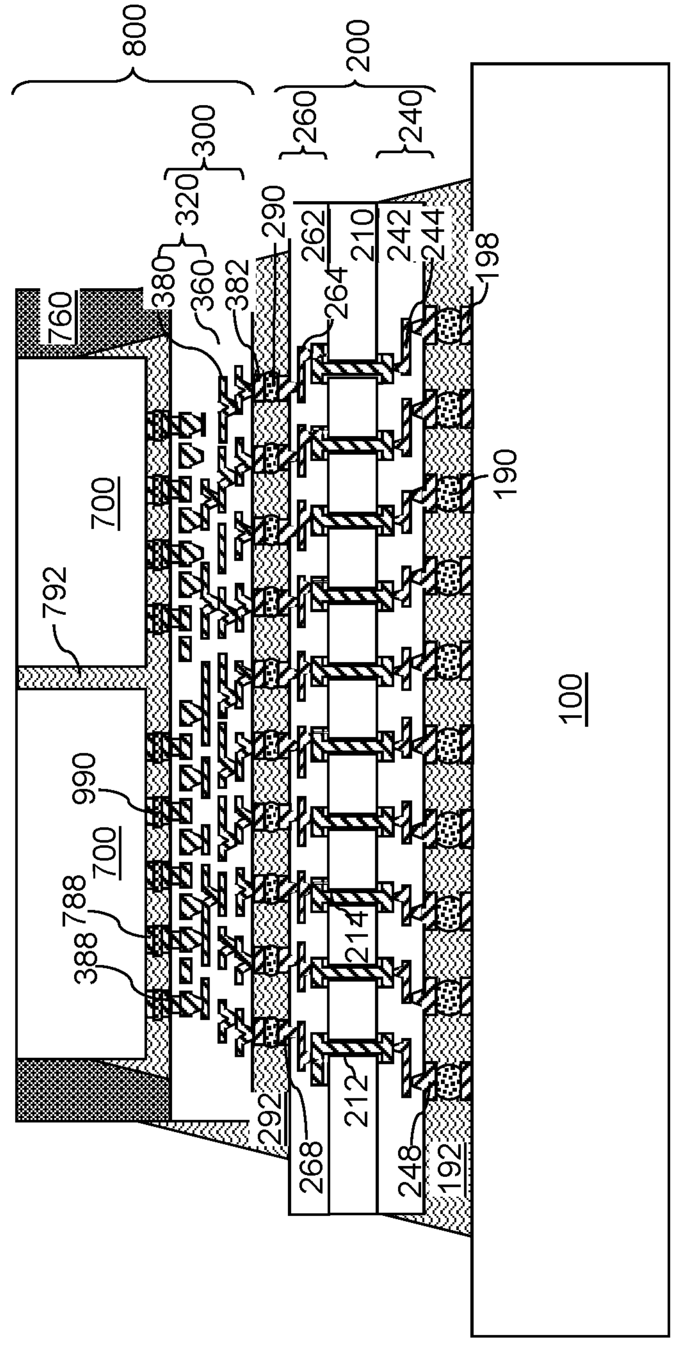
FIG. 8 is a vertical cross-sectional view of an exemplary structure including an assembly of a semiconductor die, a packaging substrate, and a printed circuit board according to an embodiment of the present disclosure.

Referring to FIG. 8, a printed circuit board (PCB) 100 including a PCB substrate and PCB bonding structures 198 may be provided. The PCB 100 includes a printed circuitry (not shown) at least on one side of the PCB substrate. An array of solder joints 190 may be formed to bond the array of board-side bonding structures 248 to the array of PCB bonding structures 198. The solder joints 190 may be formed by disposing an array of solder balls between the array of board-side bonding structures 248 and the array of PCB bonding structures 198, and by reflowing the array of solder balls. An underfill material portion 192 may be formed around the solder joints 190 by applying and shaping a third underfill material. The packaging substrate 200 is attached to the PCB 100 through the array of solder joints 190.

Figure 9:
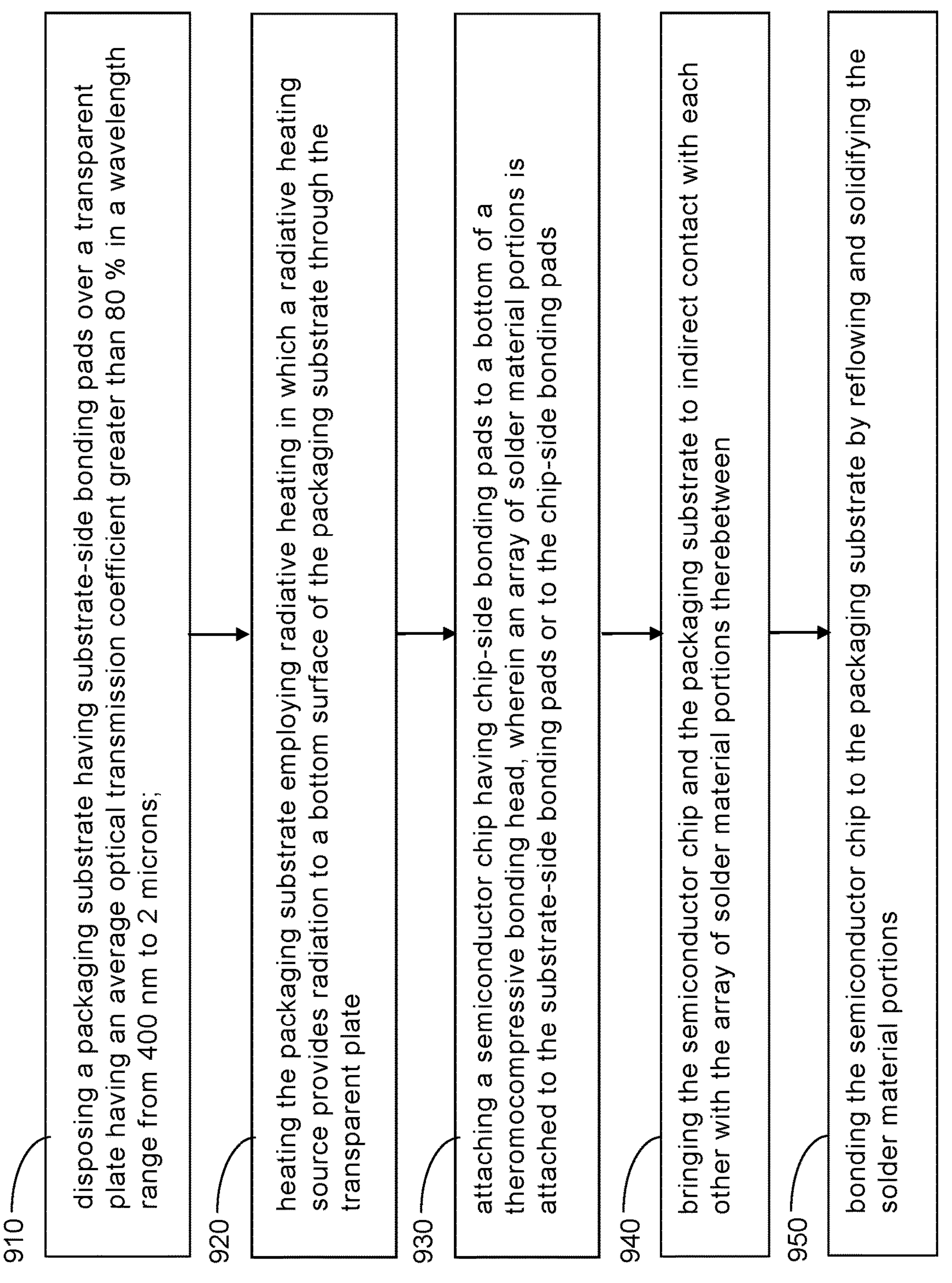
FIG. 9 is a first flowchart illustrating steps for forming a bonded assembly according to an embodiment of the present disclosure.

Referring to FIG. 9, a first flowchart illustrates steps for forming a bonded assembly according to an embodiment of the present disclosure.

Referring to step 910 and FIGS. 2A, 2B, 5A, and 5B, a packaging substrate 200 having substrate-side bonding structures 268 may be disposed over a transparent plate 600 having an average optical transmission coefficient greater than 80% in a wavelength range from 400 nm to 2 microns.

Referring to step 920 and FIGS. 2A, 2B, 5A, and 5B, the packaging substrate 200 may be heated using radiative heating in which a radiative heating source provides radiation to a bottom surface of the packaging substrate 200 through the transparent plate 600.

Referring to step 930 and FIGS. 1, 2A, 2B, 5A, and 5B, a semiconductor die 800 having die-side bonding structures 382 may be attached to a bottom of a thermocompressive bonding head 900. An array of solder material portions 290 is attached to the substrate-side bonding structures 268 or to the die-side bonding structures 382.

Referring to step 940 and FIGS. 3, 4, and 6, the semiconductor die 800 and the packaging substrate 200 may be brought to indirect contact with each other with the array of solder material portions 290 therebetween.

Referring to step 950 and FIGS. 3, 4, 6, 7A, 7B, and 8, the semiconductor die 800 to the packaging substrate 200 may be bonded by reflowing and solidifying the solder material portions 290.

In one embodiment, the semiconductor die 800 and the packaging substrate 200 may be brought to indirect contact with each other while maintaining a top surface of the semiconductor die 800 at a first temperature and while maintaining a bottom surface of the packaging substrate 200 at a second temperature that is higher than the first temperature. In one embodiment, the second temperature may be higher than a reflow temperature of the solder material portions 290. In one embodiment, the first temperature is lower than a reflow temperature of the solder material portions 290. In one embodiment, the array of solder material portions 290 may be attached to the die-side bonding structures 382 prior to bringing the semiconductor die 800 and the packaging substrate 200 to indirect contact with each other. In one embodiment, the array of solder material portions 290 may be attached to the substrate-side bonding structures 268 prior to bringing the semiconductor die 800 and the packaging substrate 200 to indirect contact with each other. In one embodiment, the radiative heating source 620, 630 may include an electrical heater 620 that directs incoherent radiation toward the transparent plate 600. In one embodiment, the radiative heating source 620, 630 may include at least one laser source 630 that scans a laser beam within an area of the transparent plate 600 in a raster pattern. In one embodiment, reflowing and solidifying of the solder material portions 290 may include temporarily increasing a temperature at the bottom surface of the packaging substrate 200 while maintaining a temperature at the bottom of the thermocompressive bonding head 900 at a constant temperature. In one embodiment, the constant temperature is lower than a reflow temperature of the solder material portions 290. In one embodiment, at least one thermocouple 610 may be embedded within an upper portion of the transparent plate 600 and/or may be located on a bottom surface of the transparent plate 600. Alternatively or additionally, at least one pyrometer 660 may be configured to measure the temperature of a respective temperature measurement location on, or in, the transparent plate 600; and the method may include controlling a thermal output of the radiative heating source (620, 630) based on an input from at least one temperature measurement device (such as at least one thermocouple 610 and/or at least one pyrometer 660) such that a temperature at each temperature measurement location (such as the tip of each of the at least one thermocouple 610 and/or the temperature measurement location(s) of the at least one pyrometer 660) may be maintained at a respective target temperature prior to, and while, the semiconductor die 800 and the packaging substrate 200 are brought to indirect contact with each other. In one embodiment, each of the respective target temperature is in a range from a reflow temperature of the solder material portions 290 less 20 degrees Celsius to the reflow temperature of the solder material portions 290 plus 110 degrees Celsius prior to bringing the semiconductor die 800 and the packaging substrate 200 to indirect contact with each other; and each of the respective target temperature may be raised to a temperature in a range from the reflow temperature of the solder material portions 290 plus 5 degrees Celsius to the reflow temperature plus 110 degrees during reflow of the solder material portions 290.

Figure 10:
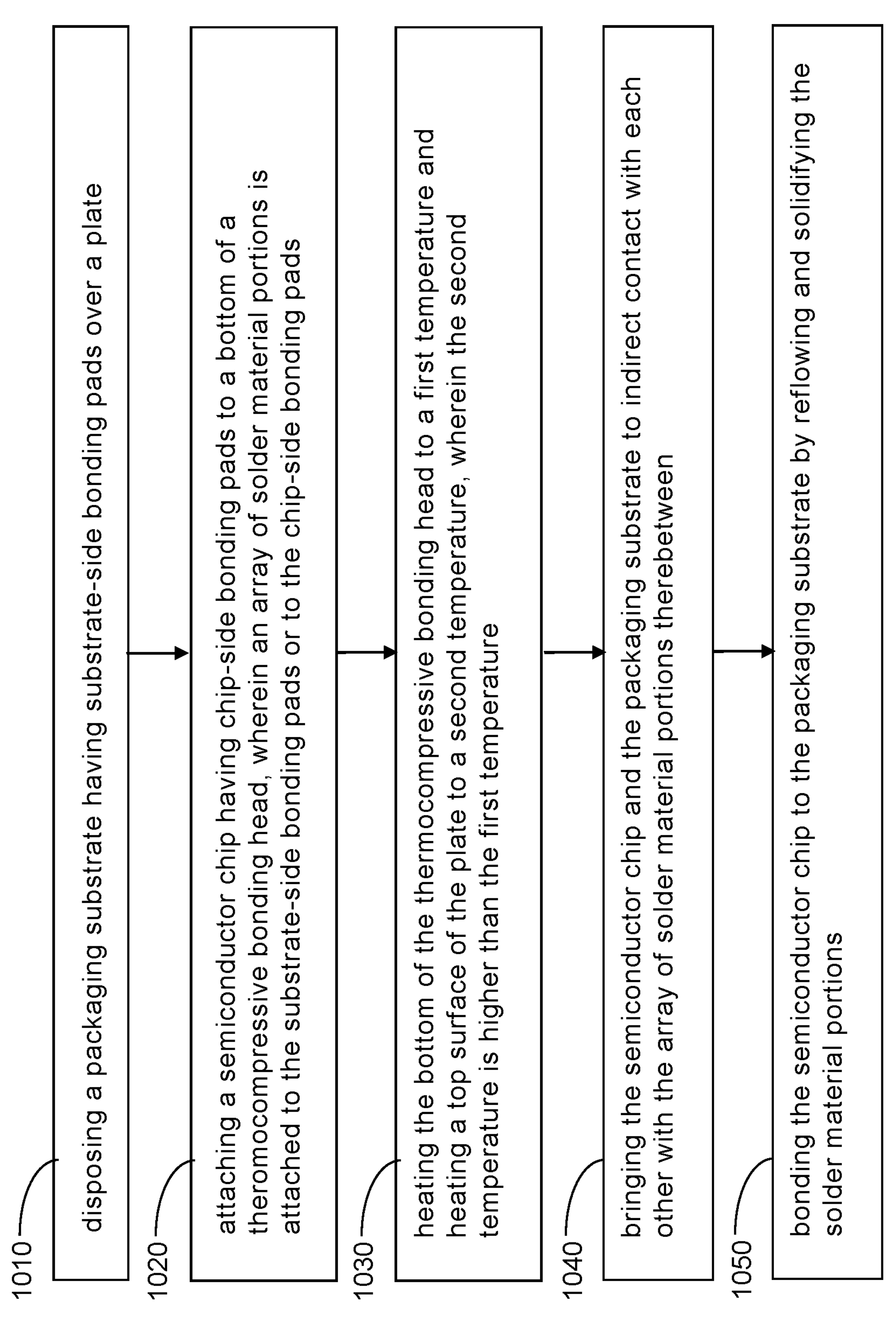
FIG. 10 is a second flowchart illustrating steps for forming a bonded assembly according to an embodiment of the present disclosure.

Referring to FIG. 10, a second flowchart illustrates steps for forming a bonded assembly according to an embodiment of the present disclosure.

Referring to step 1010 and FIGS. 2A, 2B, 5A, and 5B, a packaging substrate 200 having substrate-side bonding structures 268 may be disposed over a plate (such as the transparent plate 600).

Referring to step 1020 and FIGS. 1, 2A, 2B, 5A, and 5B, a semiconductor die 800 having die-side bonding structures 382 may be attached to a bottom of a thermocompressive bonding head 900. An array of solder material portions 290 is attached to the substrate-side bonding structures 268 or to the die-side bonding structures 382.

Referring to step 1030 and FIGS. 2A, 2B, 3, 5A, and 5B, the bottom of the thermocompressive bonding head 900 may be heated to a first temperature T1 and heating a top surface of the plate 600 to a second temperature T2. The second temperature T2 is higher than the first temperature T1.

Referring to step 1040 and FIGS. 3, 4, and 6, the semiconductor die 800 and the packaging substrate 200 may be brought to indirect contact with each other with the array of solder material portions 290 therebetween.

Referring to step 1050 and FIGS. 3, 4, 6, 7A, 7B, and 8, the semiconductor die 800 may be bonded to the packaging substrate 200 by reflowing and solidifying the solder material portions 290.

In one embodiment, the first temperature is lower than a reflow temperature of the solder material portions 290; and the second temperature is higher than the reflow temperature of the solder material portions 290. In one embodiment, a temperature of the bottom of the thermocompressive bonding head 900 remains below a reflow temperature of the solder material portions 290 for an entire duration of time in which the solder material portions 290 are reflowed and solidified. In one embodiment, the plate 600 comprises a transparent plate having an average optical transmission coefficient greater than 80% in a wavelength range from 400 nm to 2 microns; and the method may include heating the packaging substrate 200 using radiative heating in which a radiative heating source 620, 630 provides radiation to a bottom surface of the packaging substrate 200 through the transparent plate 600.

The various embodiments of the present disclosure may be used to form a bonded assembly of a semiconductor die 800 and a packaging substrate 200. By inducing a net heat flow from the packaging substrate 200 through the solder material portions 290 into the semiconductor die 800 during bonding, thermal cycling of the semiconductor die 800 may be reduced, and thermal degradation of the semiconductor die 800 may be minimized.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a bonded assembly, the method comprising:

disposing a packaging substrate having substrate-side bonding structures over a transparent plate;

heating the packaging substrate using radiative heating in which a radiative heating source provides radiation to a bottom surface of the packaging substrate through the transparent plate;

attaching a semiconductor die having die-side bonding structures to a bottom of a thermocompressive bonding head, wherein an array of solder material portions is attached to the substrate-side bonding structures or to the die-side bonding structures;

bringing the semiconductor die and the packaging substrate to indirect contact with each other with the array of solder material portions therebetween;

bonding the semiconductor die to the packaging substrate by reflowing and solidifying the solder material portions;

measuring a temperature of a temperature measurement location in, or on, the transparent plate using a temperature measurement device; and controlling a thermal output of the radiative heating source based on an input from the temperature measurement device such that the temperature measurement location is maintained at a target temperature prior to, and while, the semiconductor die and the packaging substrate are brought to indirect contact with each other.

2. The method of claim 1, wherein the semiconductor die and the packaging substrate are brought to indirect contact with each other while maintaining a top surface of the semiconductor die at a first temperature and while maintaining a bottom surface of the packaging substrate at a second temperature that is higher than the first temperature.

3. The method of claim 2, wherein the second temperature is higher than a reflow temperature of the solder material portions.

4. The method of claim 3, wherein the first temperature is lower than a reflow temperature of the solder material portions.

5. The method of claim 2, wherein the method comprises:

holding a bottom surface of the packaging substrate at a pre-bonding plate temperature that is lower than the second temperature prior to bringing the semiconductor die and the packaging substrate to indirect contact with each other;

heating the bottom surface of the packaging substrate at the second temperature after the semiconductor die and the packaging substrate are brought to indirect contact with each other; and cooling the bottom surface of the packaging substrate at a post-bonding plate temperature that is lower than the second temperature after reflowing and solidifying the solder material portions.

6. The method of claim 1, wherein the array of solder material portions is attached to the die-side bonding structures prior to bringing the semiconductor die and the packaging substrate to indirect contact with each other.

7. The method of claim 1, wherein the array of solder material portions is attached to the substrate-side bonding structures prior to bringing the semiconductor die and the packaging substrate to indirect contact with each other.

8. The method of claim 1, wherein the radiative heating source comprises a heater that directs incoherent radiation toward the transparent plate.

9. The method of claim 1, wherein the radiative heating source comprises at least one laser source that scans a laser beam within an area of the transparent plate in a raster pattern.

10. The method of claim 1, wherein reflowing and solidifying of the solder material portions comprises temporarily increasing a temperature at the bottom surface of the packaging substrate while maintaining a temperature at the bottom of the thermocompressive bonding head at a temperature that is lower than a reflow temperature of the solder material portions.

11. The method of claim 1, wherein:

the target temperature is in a range from a reflow temperature of the solder material portions less 20 degrees Celsius to the reflow temperature of the solder material portions plus 110 degrees Celsius prior to bringing the semiconductor die and the packaging substrate to indirect contact with each other; and the target temperature is raised to a temperature in a range from the reflow temperature of the solder material portions plus 5 degrees Celsius to the reflow temperature plus 110 degrees during reflow of the solder material portions.

12. A method of forming a bonded assembly, the method comprising:

disposing a packaging substrate having substrate-side bonding structures over a transparent plate;

attaching a semiconductor die having die-side bonding structures to a bottom of a thermocompressive bonding head, wherein an array of solder material portions is attached to the substrate-side bonding structures or to the die-side bonding structures;

holding a top surface of the transparent plate at a pre-bonding plate temperature that is lower than a reflow temperature of the solder material portions;

heating the bottom of the thermocompressive bonding head to a first temperature which is lower than the reflow temperature;

heating the top surface of the transparent plate to a second temperature, wherein the second temperature is higher than the reflow temperature;

bringing the semiconductor die and the packaging substrate to indirect contact with each other with the array of solder material portions therebetween while maintaining the top surface of the semiconductor die at the first temperature and while maintaining a bottom surface of the packaging substrate at the second temperature, thereby producing a net heat flow from the packaging substrate through the solder material portions into the semiconductor die; and bonding the semiconductor die to the packaging substrate by reflowing and solidifying the solder material portions.

13. The method of claim 12, wherein a temperature of the bottom of the thermocompressive bonding head remains below a reflow temperature of the solder material portions for an entire duration of time in which the solder material portions are reflowed and solidified.

14. The method of claim 12, wherein:

the transparent plate has an average optical transmission coefficient greater than 80% in a wavelength range from 400 nm to 2 microns; and the method comprises heating the packaging substrate using radiative heating in which a radiative heating source provides radiation to a bottom surface of the packaging substrate through the transparent plate.

15. An apparatus comprising:

a transparent plate having an average optical transmission coefficient greater than 80% in a wavelength range from 400 nm to 2 microns and configured to hold a substrate thereupon;

a radiative heating source configured to heat a bottom surface of the substrate by providing radiation through the transparent plate;

a thermocompressive bonding head configured to hold a semiconductor die over the substrate;

a process controller comprising a processor and a memory in communication with the processor and configured to run an automated bonding process control program that comprises:

heating a bottom surface of the thermocompressive bonding head to a first temperature;

heating a top surface of the transparent plate to a second temperature that is higher than the first temperature;

reflowing solder material portions, wherein the top surface of the transparent plate is heated to a third temperature not lower than the second temperature; and heating the top surface of the transparent plate to a fourth temperature not higher than the third temperature, wherein the radiative heating source comprises at least one laser source that scans a laser beam within an area of the transparent plate in a raster pattern.

16. The apparatus of claim 15, wherein:

the automated bonding process control program is configured to receive or determine a solder reflow temperature of solder material portions to be used either as a direct input or as a calculated quantity derived from an input that identifies a material composition of the solder material portions;

the automated bonding process control program sets the first temperature below the solder reflow temperature; and the automated bonding process control program sets the second temperature above the solder reflow temperature.

17. The method of claim 12, wherein the method induces a net heat flow from the packaging substrate through the solder material portions into the semiconductor die during bonding of the semiconductor die to the packaging substrate.

18. The method of claim 12, wherein a temperature at the top surface of the semiconductor die remains below the reflow temperature of the solder material portions throughout the bonding the semiconductor die to the packaging substrate.

19. The method of claim 12, further comprising:

measuring a temperature of a temperature measurement location in, or on, the transparent plate using a temperature measurement device.

20. The method of claim 19, further comprising:

controlling a thermal output of a radiative heating source based on an input from the temperature measurement device such that the temperature measurement location is maintained at a target temperature prior to, and while, the semiconductor die and the packaging substrate are brought to indirect contact with each other.

* * * * *